(12) United States Patent
Blais et al.

(10) Patent No.: US 8,673,761 B2
(45) Date of Patent: Mar. 18, 2014

(54) REFLOW METHOD FOR LEAD-FREE SOLDER

(75) Inventors: Pascal Blais, Shefford (CA); Clement Fortin, Eastman (CA)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 13/031,183

(22) Filed: Feb. 19, 2011

(65) Prior Publication Data

US 2012/0211276 A1    Aug. 23, 2012

(51) Int. Cl.
*B23K 31/02* (2006.01)
*H01L 23/488* (2006.01)

(52) U.S. Cl.
USPC .................. 438/612; 228/180.22; 228/200

(58) Field of Classification Search
None
See application file for complete search history.

(56) References Cited

U.S. PATENT DOCUMENTS

| | | | |
|---|---|---|---|
| 6,805,974 B2 | 10/2004 | Choi et al. | |
| 7,591,913 B2 | 9/2009 | Ren et al. | |
| 2003/0156969 A1* | 8/2003 | Choi et al. | 420/560 |
| 2004/0010836 A1 | 1/2004 | Audi | |
| 2004/0112478 A1 | 6/2004 | Bieler et al. | |
| 2005/0023327 A1* | 2/2005 | Pendse | 228/180.22 |
| 2005/0029675 A1 | 2/2005 | Hua | |
| 2005/0153523 A1 | 7/2005 | Hua | |
| 2008/0290142 A1 | 11/2008 | Hougham et al. | |
| 2010/0203353 A1 | 8/2010 | Anderson et al. | |
| 2011/0017809 A1* | 1/2011 | Berger et al. | 228/231 |
| 2011/0303448 A1 | 12/2011 | Anderson et al. | |
| 2012/0018878 A1 | 1/2012 | Cheng et al. | |

FOREIGN PATENT DOCUMENTS

| | | |
|---|---|---|
| WO | WO2006028668 A1 | 3/2006 |
| WO | WO2012109745 A1 | 8/2012 |

OTHER PUBLICATIONS

D. Swenson, "The Effects of Suppressed Beta Tin Nucleation on the Microstructural Evolution of Lead-Free Solder Joints", Journal of Materials Science: Materials in Electronics, vol. 18, Nos. 1-3/ Mar. 2007; pp. 39-54.
International Application No. PCT/CA2012/050076; International Search Report dated Jul. 23, 2013; 2 pages.

* cited by examiner

*Primary Examiner* — Zandra Smith
*Assistant Examiner* — Pamela E Perkins
(74) *Attorney, Agent, or Firm* — Cantor Colburn LLP; Matthew Zehrer

(57) ABSTRACT

A reflow method for solder includes heating the solder to a first temperature that is above a liquidus temperature of the solder; cooling the solder to a second temperature that is below a solidification temperature of the solder; reheating the solder to a third temperature that is above a solidus temperature of the solder and below the liquidus temperature of the solder; cooling the solder to a fourth temperature that is below the solidification temperature of the solder.

21 Claims, 3 Drawing Sheets

REFLOW METHOD FOR LEAD-FREE SOLDER

BACKGROUND

This disclosure relates generally to the field of semiconductor assembly, and more specifically to a reflow method for lead-free solder for a semiconductor assembly.

A semiconductor assembly may include a circuitry on one component connected to circuitry on another component by a metal (or C4) layer comprising metallic interconnects made of solder. A semiconductor assembly may also include solder contacts to circuitry on a semiconductor wafer. The solder used for such interconnects and contacts has typically comprised metallic alloys containing lead (Pb), which have a relatively low melting temperature and are highly reliable. Unfortunately, lead is toxic and environmentally hazardous; therefore, lead-free solder is used as an alternative to lead-containing solder. Lead-free solder may comprise various alloying elements, such as tin (Sn) based alloys including, for example, silver (Ag) and/or copper (Cu). However, the solidification of lead-free solder may be difficult to control because solidification occurs in an undercooling state. Undercooling occurs when a metal is cooled without forming crystals to a temperature that is below the temperature at which crystallization normally takes place. Intermetallic compounds formed during the soldering process may be trapped at dendrite arms that form during undercooling, thus forming a relatively rigid solidified solder. Rigid interconnects may induce stress in the connected components, increasing the risk of mechanical failure or cracking of the semiconductor chip assembly, and rigid contacts may cause difficulties in connecting testing probes to the contacts during wafer testing, possibly resulting in multiple retests.

BRIEF SUMMARY

In one aspect, a reflow method for solder includes heating the solder to a first temperature that is above a liquidus temperature of the solder; cooling the solder to a second temperature that is below a solidification temperature of the solder; reheating the solder to a third temperature that is above a solidus temperature of the solder and below the liquidus temperature of the solder; cooling the solder to a fourth temperature that is below the solidification temperature of the solder.

In another aspect, a semiconductor assembly is formed by the steps of heating solder in the semiconductor assembly to a first temperature that is above a liquidus temperature of the solder; cooling the solder to a second temperature that is below a solidification temperature of the solder; reheating the solder to a third temperature that is above a solidus temperature of the solder and below the liquidus temperature of the solder; cooling the solder to a fourth temperature that is below the solidification temperature of the solder.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Figure 1:
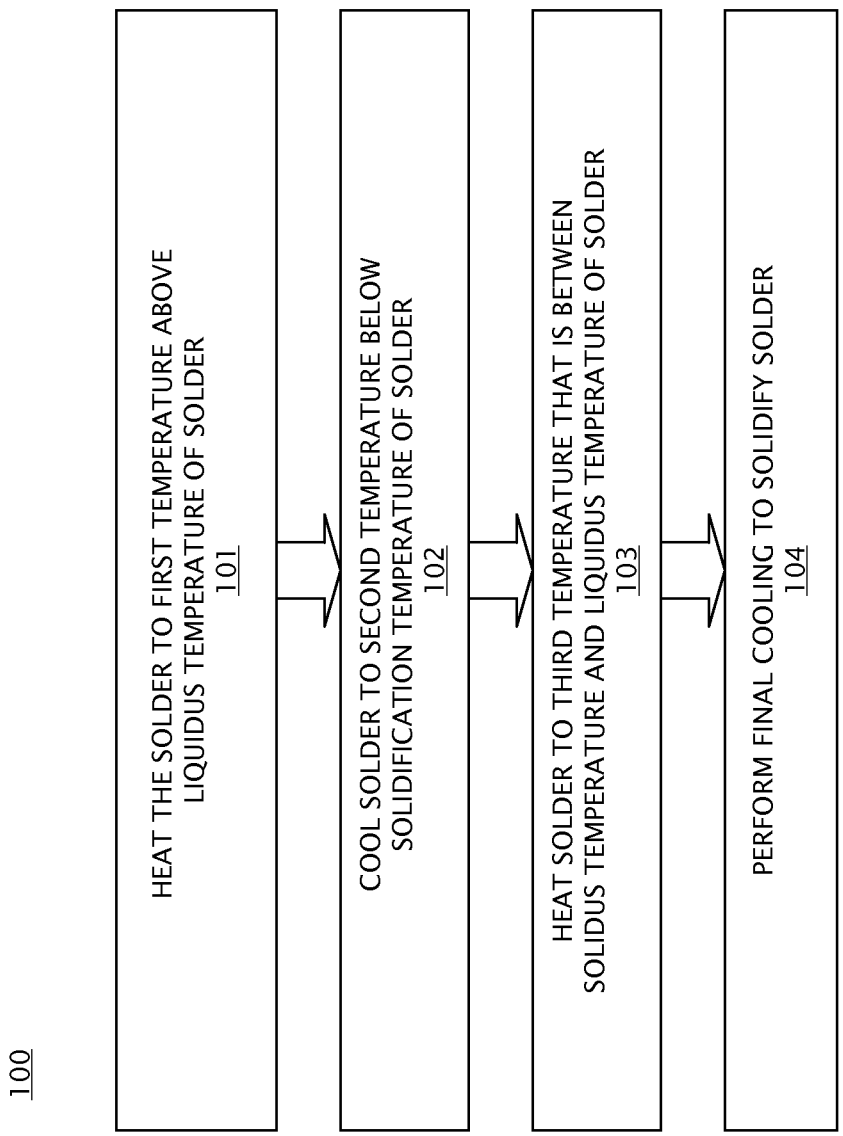
FIG. 1 illustrates a flowchart of an embodiment of a reflow method for lead-free solder.

Embodiments of a reflow method for lead-free solder, which may be used for formation of contacts or interconnects for a semiconductor assembly, are provided, with exemplary embodiments being discussed below in detail. To reduce the rigidity caused in the lead-free solder by undercooling, the reflow process reheats the solder to a temperature selected to melt only a portion of alloy phases that comprise the solder. The second heating causes grains of a single alloy phase to form in the solder. The grains are relatively ductile; therefore, rigidity caused by undercooling in lead-free solder may be reduced or eliminated by the second heating. This results in reduced stress in interconnects between components in a semiconductor assembly, and improved quality contacts that may reduce the need for retesting a wafer. The solder may comprise a lead-free alloy solder, and may be tin-based.

A material is fully liquid at a temperature referred to as the material's liquidus temperature, and, in theory, fully solid at a temperature referred to as the material's solidus temperature. However, in small amounts of a material, such as are used to form solder interconnects or contacts for semiconductor assemblies, solidification may occur at a solidification temperature that is below the solidus temperature of the material because cooling of the small amount of the material may occur very quickly. This is referred to as an undercooling state. Every material has a particular liquidus temperature, solidus temperature, and, in cases in which solidification occurs below the solidus temperature, solidification temperature. For a pure elemental materials, the liquidus temperature and solidus temperature may be the same temperature; however, for an alloy material that includes multiple phases, different phases in the alloy may liquefy or solidify at different temperatures. Therefore, there may be a gap between the liquidus temperature and the solidus/solidification temperatures of an alloy. Controlled heating of an alloy to a temperature that is between its liquidus temperature and its solidus temperature may bring the alloy from a solid state to a liquid+solid state, in which a portion of the alloy phases are liquefied, with the primary solidification phase remaining solid. For example, for tin-based hypoeutectic lead-free solder alloy, the primary solidification phase is tin. The other phases in tin-based solder (for example, eutectic phase comprising $Ag_3Sn$ or $Cu_6Sn_5$) liquefy at a lower temperature than the tin. Liquefying some phases of the solder allows purification of the phases of the solder that remains solid. The liquid phases are more mobile than the solid phases, causing the liquid phases move to the edges of the solid phases. This results in the solid phase of the solder clumping into grains. In particular, the pure tin phase of a tin-based, lead-free solder may form pure tin grains, which coarsen and form ductile regions in the finished interconnect. The pure tin grains reduce the rigidity of the cooled solder. The liquefied eutectic phase comprising the intermetallic compounds may then be solidified between the primary solidification phases during final solidification of the contact or interconnect at the solidus temperature.

Figure 2:
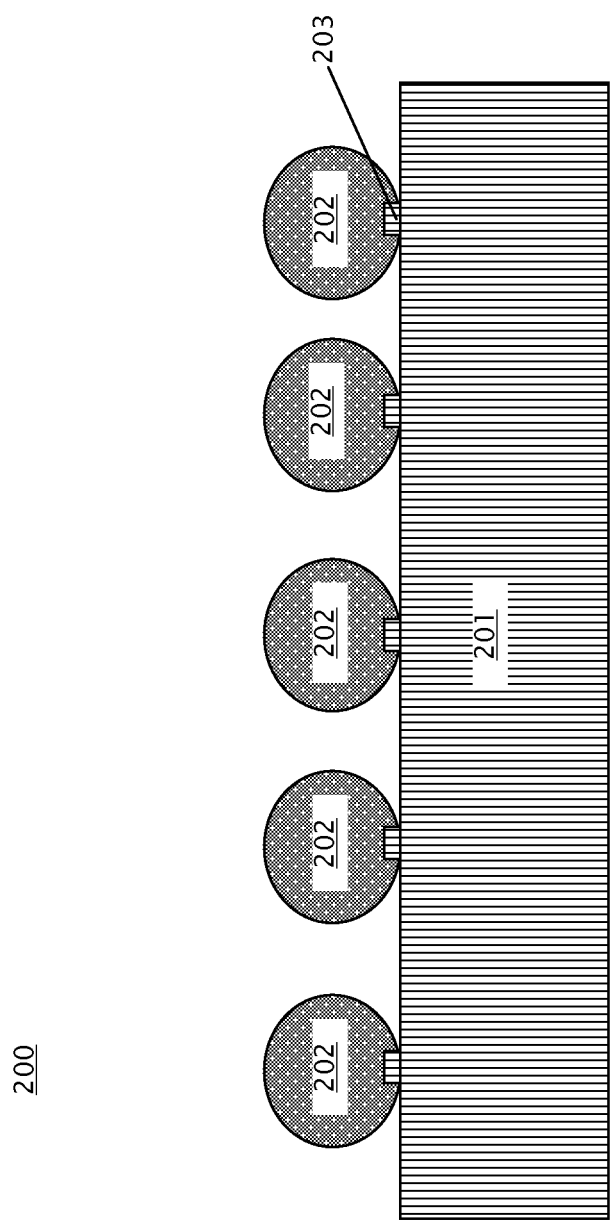
FIG. 2 is a schematic block diagram illustrating an exemplary embodiment of contacts on a semiconductor wafer.
Figure 3:
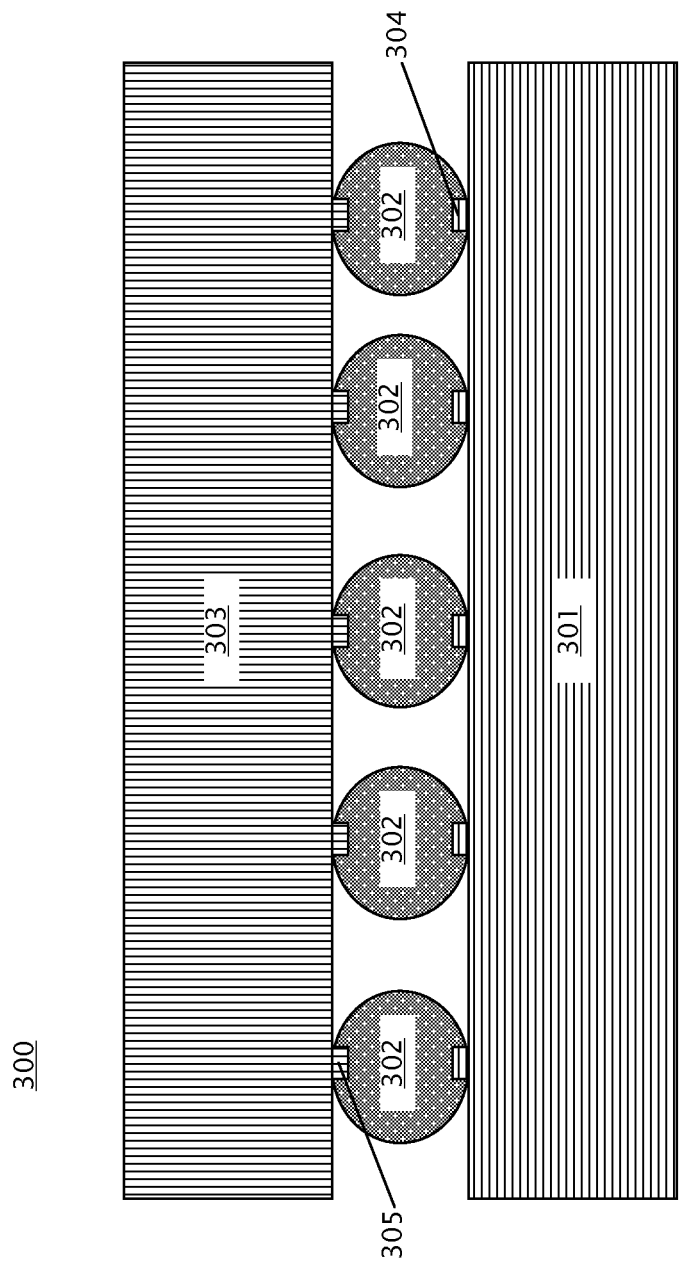
FIG. 3 is a schematic block diagram illustrating an exemplary embodiment of a connected semiconductor assembly.

FIG. 1 illustrates a flowchart of an embodiment of a reflow method 100 for lead-free solder. Method 100 may be applied in any appropriate soldering process to reduce the effects of undercooling in lead-free solder. Method 100 of FIG. 1 is discussed below with respect to formation of contacts on a semiconductor wafer, as shown in FIG. 2, and to formation of interconnects between contact pads on a first component and contact pads on a second component, as is shown in FIG. 3. To form contacts as shown in FIG. 2, the solder 202 is initially placed on contact pads 203 on a wafer 201. To form interconnects such as is shown in FIG. 3, a first set of contact pads 304 on first component 301 is aligned with a second set of contact pads 305 on a second component 302, with the solder 302 located between the first set of contact pads 304 and the second set of contact pads 305. Then, in block 101, the solder 202/302 is heated to a first temperature that melts the solder 202/302; the first temperature is above the liquidus temperature of the solder.

The wafer 201, first component 301, and second component 302 may include any appropriate type of electrical circuitry connected to the respective contact pads 203, 304, and 305. For example, wafer 201, first component 301, and/or second component 302 may be semiconductor chips comprising any appropriate number and type of semiconductor devices in some embodiments. In some embodiments, wafer 201, first component 301, and/or second component 302 may include a flip chip, a substrate, a circuit board, a bare die, or a package die. The solder 202/302 comprises a lead-free metallic alloy, which may be a tin-based alloy, and may further include any additional appropriate metal(s), including but not limited to silver and/or copper.

In block 102, the solder 202/302 is cooled to a second temperature that is below the solidification temperature of the solder alloy in order to achieve complete solidification of the solder 202/302. The temperature at which the solder 202/302 is fully solidified (i.e., the solidification temperature) may be below the solidus temperature of the solder, resulting in undercooling in solder 202/302. The second temperature may be controlled to limit stress transfer to the wafer 201, or to the first component 301 and second component 302. In some embodiments, the second temperature may be about 40° C. or higher, or in a range that is less then about 30° C. below the solidification temperature of the solder.

In block 103, the solder 202/302 is reheated to a third temperature that is between the solidus temperature and the liquidus temperature of the solder 202/302, putting the solder 202/302 in a liquid+solid state. The solid alloy phases in solder 202/302 clump together to form grains during the reheating of block 103, and the liquid alloy phases are pushed to the grain boundaries. For a tin-based solder, relatively large grains of pure tin are formed, and intermetallic compounds (for example, $Ag_3Sn$ or $Cu_6Sn_5$) in the solder 202/302 are pushed outside of the primary solidification phase (i.e., the tin). The pure tin grains are more ductile than the intermetallic compounds when solidified, so formation of relatively large tin grains in the solder results in reduced rigidity in solder 202/302.

In block 104, the final cooling and solidification of the solder 202/302 is performed, resulting in solder contacts 202 as shown in FIG. 2, or solder interconnects 302 as shown in FIG. 3. Undercooling does not occur during the final solidification of block 104, due to the grain structure induced in the solder in block 103. After the final cooling of block 104, the solder contacts 202/solder interconnects 302 include relatively large, soft, ductile grains of the primary solidification phase (i.e., tin) of the solder, with the intermetallic compounds (i.e., $Ag_3Sn$ or $Cu_6Sn_5$) in the solder are pushed outside of the primary solidification phase (i.e., the tin). After the final solidification of solder contacts 202/solder interconnects 302 is performed in block 104, the semiconductor assembly 200/300 may be cleaned using, for example, water.

Solder contacts 202 and solder interconnects 302 are shown for exemplary purposes only; a semiconductor assembly formed using reflow method 100 for lead-free solder may include any appropriate number of solder contacts and/or interconnects.

The technical effects and benefits of exemplary embodiments include a relatively low cost method of reducing stress and rigidity in lead-free solder.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A reflow method for solder, the method comprising:
heating the solder to a first temperature that is above a liquidus temperature of the solder;
cooling the solder to a second temperature that is below a solidification temperature of the solder;
reheating the solder to a third temperature that is above a solidus temperature of the solder and below the liquidus temperature of the solder;
cooling the solder to a fourth temperature that is below the solidification temperature of the solder.

2. The method of claim 1, wherein the second temperature is about 40° C. or higher.

3. The method of claim 1, wherein the second temperature is less than about 30° C. below the solidification temperature of the solder.

4. The method of claim 1, further comprising aligning a first set of contact pads on a first component with a second set of contact pads on a second component before heating the solder to the first temperature, wherein the solder is located between the first set of contact pads and the second set of contact pads, and wherein the solder forms an interconnect between the first set of contact pads and the second set of contact pads after cooling the solder to the fourth temperature.

5. The method of claim 1, wherein the solder is located on a contact pad on a wafer, and wherein the solder forms an electrical contact to the contact pad after cooling the solder to the fourth temperature.

6. The method of claim 1, wherein the solder comprises a lead-free metallic alloy comprising a first phase and a second phase, wherein the first phase and the second phase are each liquefied during the heating to the first temperature; and wherein the first phase is liquefied and the second phase remains solid during the reheating to the third temperature.

7. The method of claim 6, wherein the second phase comprises tin (Sn).

8. The method of claim 7, wherein the first phase comprises Copper (Cu).

9. The method of claim 8, wherein the first phase comprises $Cu_6Sn_5$.

10. The method of claim 6, wherein the first phase comprises silver (Ag).

11. The method of claim 10, wherein the first phase comprises $Ag_3Sn$.

12. A semiconductor assembly formed by the steps of:
heating solder in the semiconductor assembly to a first temperature that is above a liquidus temperature of the solder;
cooling the solder to a second temperature that is below a solidification temperature of the solder;
reheating the solder to a third temperature that is above a solidus temperature of the solder and below the liquidus temperature of the solder;
cooling the solder to a fourth temperature that is below the solidification temperature of the solder.

13. The semiconductor assembly of claim 12, wherein the solder comprises one of an interconnect and a contact after cooling the solder to the fourth temperature.

14. The semiconductor assembly of claim 12, wherein the solder comprises a lead-free metallic alloy comprising a first phase and a second phase, wherein the first phase and the second phase are each liquefied during the heating to the first temperature; and wherein the first phase is liquefied and the second phase remains solid during the reheating to the third temperature.

15. The semiconductor assembly of claim 14, wherein the second phase comprises tin (Sn).

16. The semiconductor assembly of claim 14, wherein the second phase comprises silver (Ag).

17. The semiconductor assembly of claim 14, wherein the second phase comprises $Ag_3Sn$.

18. The semiconductor assembly of claim 14, wherein the second phase comprises Copper (Cu).

19. The semiconductor assembly of claim 14, wherein the second phase comprises $Cu_6Sn_5$.

20. The semiconductor assembly of claim 12, wherein the second temperature is about 40° C. or higher.

21. The semiconductor assembly of claim 12, wherein the second temperature is less than about 30° C. below the solidification temperature of the solder.

* * * * *